US012622111B2

(12) United States Patent
Wu et al.

(10) Patent No.: US 12,622,111 B2
(45) Date of Patent: May 5, 2026

(54) IMAGE SENSOR PACKAGE, METHOD FOR MANUFACTURING THE SAME AND ENDOSCOPE USING THE SAME

(71) Applicant: Medimaging Integrated Solution, Inc., Hsinchu (TW)

(72) Inventors: Shangyi Wu, Hsinchu (TW); Jia-De Zhou, Hsinchu (TW)

(73) Assignee: Medimaging Integrated Solution, Inc., Hsinchu (TW)

( * ) Notice: Subject to any disclaimer, the term of this patent is extended or adjusted under 35 U.S.C. 154(b) by 847 days.

(21) Appl. No.: 17/984,542

(22) Filed: Nov. 10, 2022

(65) Prior Publication Data

US 2023/0327054 A1     Oct. 12, 2023

(30) Foreign Application Priority Data

Apr. 6, 2022    (TW) .................................. 111112973

(51) Int. Cl.
H10H 20/85          (2025.01)
H10H 20/851         (2025.01)

(52) U.S. Cl.
CPC ........... H10H 20/85 (2025.01); H10H 20/851 (2025.01)

(58) Field of Classification Search
CPC ... A61B 1/0676; A61B 1/0684; A61B 1/0607; A61B 1/0011; A61B 1/00097; A61B 1/06; A61B 1/051; A61B 1/0638; H01L 23/60; H01L 25/167; H05K 2201/10106; H05K 2201/10121; H05K 2201/10151; H05K 2203/0228; H10F 55/255; H10F 77/334; H10F 77/50; H10F 39/804; H10F 39/809; H10F 39/12; H10F 55/20; G02B 23/2484; H10H 20/85; H10H 20/851; H10H 20/852; H10H 20/857; H04N 23/54; H04N 23/555

See application file for complete search history.

(56) References Cited

U.S. PATENT DOCUMENTS

| | | | |
|---|---|---|---|
| 2021/0249393 A1* | 8/2021 | Wu | H05K 1/189 |
| 2023/0108867 A1* | 4/2023 | Wu | H10F 77/50 |
| | | | 600/109 |
| 2023/0118866 A1* | 4/2023 | Chen | A61B 1/0676 |
| | | | 600/109 |
| 2023/0262310 A1* | 8/2023 | Chen | H04N 23/57 |
| | | | 348/207.99 |
| 2023/0308738 A1* | 9/2023 | Wu | H01L 23/34 |

* cited by examiner

*Primary Examiner* — Chad M Dicke
*Assistant Examiner* — Priya M Rampersaud
(74) *Attorney, Agent, or Firm* — MUNCY, GEISSLER, OLDS & LOWE, P.C.

(57) ABSTRACT

A method for manufacturing an image sensor package is provided, in which a plurality of trenches is provided in the package substrate and the trenches and a plurality of predetermined dicing lines define the desired contour of the package substrate to maximize the space utilization of the image sensor package in the distal end of the endoscope. In addition, the contour of the package substrate matches the shape of the distal end of the endoscope, thus facilitating the positioning and assembly of the image sensor package. An image sensor package manufactured by the abovementioned manufacturing method and an endoscope including the image sensor package are also disclosed.

18 Claims, 11 Drawing Sheets

IMAGE SENSOR PACKAGE, METHOD FOR MANUFACTURING THE SAME AND ENDOSCOPE USING THE SAME

BACKGROUND OF THE INVENTION

1. Field of the Invention

The present invention relates to an image sensor package, a method for manufacturing the same and an endoscope using the same, particularly to an image sensor package having an illumination element, a method for manufacturing the same and an endoscope using the same.

2. Description of the Prior Art

An endoscope can reach cavities, which the naked eyes are unlikely to observe directly. Therefore, endoscopes have been extensively used in industry and medicine. Especially, the application of endoscopes to medicine favors medical diagnosis very much. An endoscope may access cavities of a human body through tiny channels of the human body. For an example, an endoscope may reach the lung through a bronchial tube. For another example, an endoscope may enter the bladder through the urinary tract. Hence, miniaturizing an endoscope has become an important subject of the concerned field.

Refer to FIG. 1. In a conventional endoscope 10, an image sensor 11 and light emitting elements 12 are disposed on a flexible circuit board 13; cables 14 are soldered to the corresponding electric-conduction contacts 131 of the flexible circuit board 13. After the flexible circuit board 13 is bent to have the desired shape, the abovementioned elements are encapsulated with a plastic material to assume a fixed form in an injection-molding method. The conventional technology is more complicated in the structure and fabrication process. Further, the endoscope 10 has a larger size. Besides, the light-output surfaces of the light emitting elements 11 are unlikely to face upwards, and the light emitting elements 12 are hard to be disposed around the image sensor 11. Therefore, the conventional endoscope has disadvantages of low light utilization efficiency, non-uniform illumination, and likeliness of shadows and blind spots.

Accordingly, the manufacturers are eager to develop an endoscope that is miniaturized and able to provide uniform illumination.

SUMMARY OF THE INVENTION

The present invention provides an image sensor package, a method for manufacturing the same and an endoscope using the same, wherein appropriate trenches are formed in a package substrate and cooperate with a plurality of predetermined dicing lines to define the required contour of the package substrate, whereby to maximize the efficiency that the image sensor package utilizes the distal-end space of the endoscope. Further, the shape of the image sensor package matches the distal-end shape of the endoscope, favoring the positioning and assembly of the image sensor package.

In one embodiment, the method for manufacturing an image sensor package of the present invention comprises steps: providing a package substrate having a first surface, a second surface opposite to the first surface, a plurality of trenches, and a plurality of predetermined dicing lines, wherein the plurality of trenches penetrates the first surface and the second surface and cooperates with the plurality of predetermined dicing lines to define a plurality of substrate units arranged in array, and wherein the first surface of the package substrate of each substrate unit has a plurality of first conductive contacts, and wherein the second surface of the package substrate of each substrate unit has a plurality of second conductive contacts and a plurality of third conductive contacts, and wherein the plurality of second conductive contacts and the plurality of third conductive contacts are electrically connected with the plurality of corresponding first conductive contacts; disposing an image sensor on the second surface of the package substrate and electrically connecting the image sensor with the plurality of second conductive contacts; disposing at least one light emitting element on the second surface of the package substrate and electrically connecting the light emitting element with the third conductive contacts; forming an encapsulation body covering the sidewalls of the image sensor and the light emitting element and avoiding covering the plurality of trenches and a light input surface of the image sensor; cutting the package substrate along the plurality of dicing lines to separate the plurality of substrate units and generate single image sensor packages.

In one embodiment, the image sensor package of the present invention is manufactured according to the abovementioned method for manufacturing an image sensor package.

In one embodiment, the endoscope of the present invention comprises a first tube, a second tube, an image sensor package and an electric connector. A distal end of the first tube is used to extend to a cavity. The second tube is disposed inside the first tube to function as a working channel. The image sensor package is manufactured according to the abovementioned method for manufacturing an image sensor package and disposed at a distal end of the first tube and in a receiving space between the first tube and the second tube. The electric connector is electrically connected with the image sensor package and makes the endoscope electrically connected with an external electronic device in a pluggable way.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENTS

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided; however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
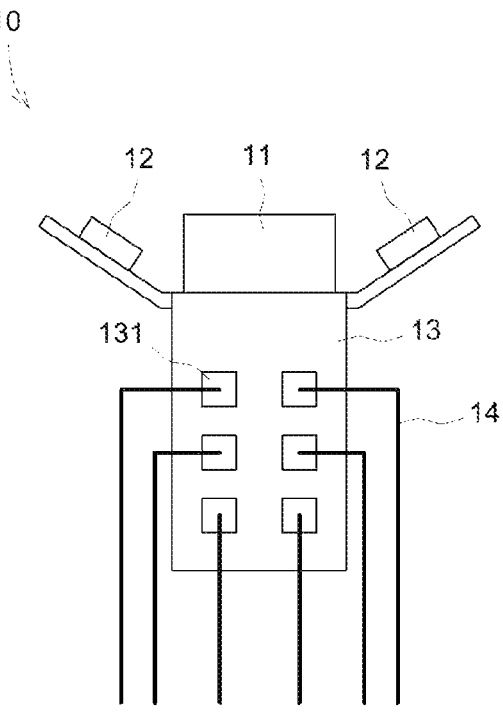
FIG. 1 is a diagram schematically showing the structure of an image sensor of a conventional endoscope.
Figure 2A:
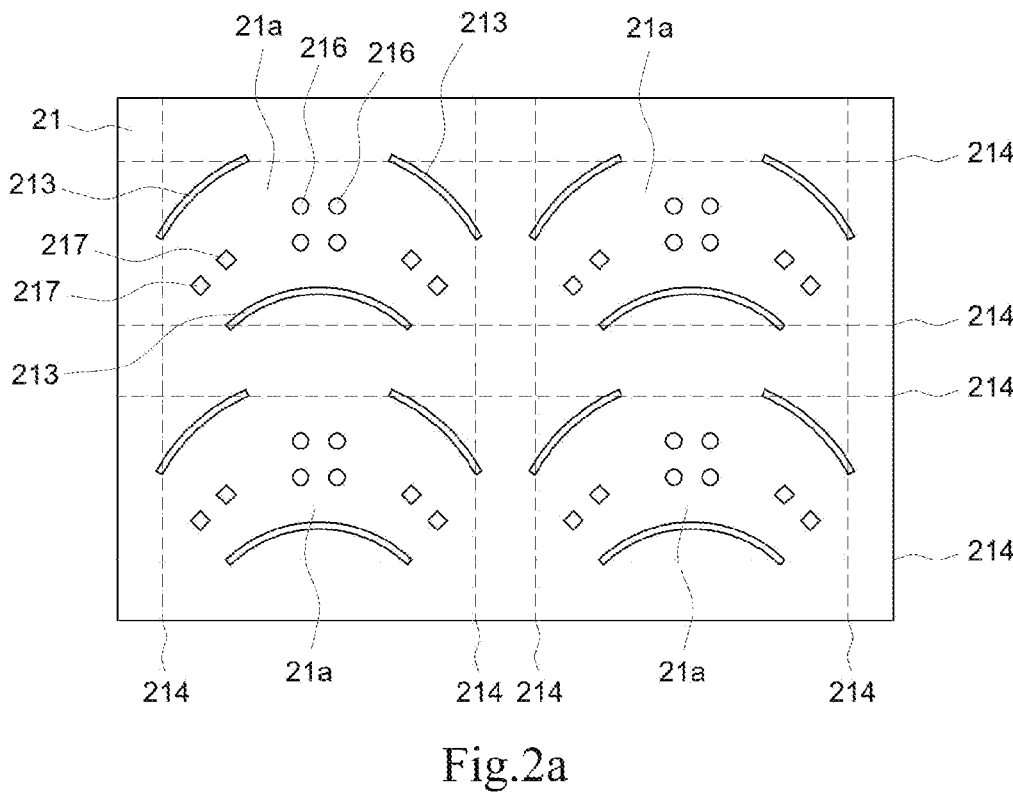
FIGS. 2a, 2b, 2c, 2d, 3a, 3b, 4a, 4b, 4c, 5a, 5b, 5c, 6a, 6b, 7 and 8 are diagrams schematically showing a method for manufacturing an image sensor package according to one embodiment of the present invention.
Figure 2B:
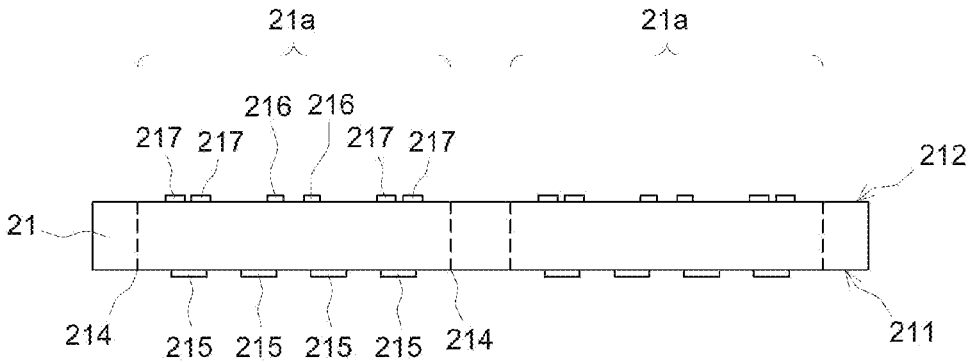

Refer to FIGS. 2a, 2b, 2c, 2d, 3a, 3b, 4a, 4b, 4c, 5a, 5b, 5c, 6a, 6b, 7 and 8 for a method for manufacturing an image sensor package according to one embodiment of the present invention. Refer to FIG. 2a and FIG. 2b, wherein FIG. 2a is a schematic top view, and FIG. 2b is a schematic side view. Firstly, provide a package substrate 21. In one embodiment, the package substrate may be a ceramic substrate, a printed circuit board or a flexible printed circuit board. The package substrate 21 has a first surface 211 and a second surface 212 opposite to the first surface 211, a plurality of trenches 213, and a plurality of predetermined dicing lines 214. The predetermined dicing line 214 is the predetermined position, along which the package substrate 21 is to be cut afterwards. Therefore, it is not necessary to form recognizable marks on the package substrate 21.

The plurality of trenches 213 penetrates the first surface 211 and the second surface 212 of the package substrate 21. The plurality of trenches 213 and the plurality of predetermined dicing lines 214 define a plurality of substrate units 21a. In other words, each substrate unit 21a is surrounded by at least one trench 213 and a plurality of predetermined dicing lines 214. In the embodiment shown in FIG. 2a, the package substrate 21 includes 2×2 substrate units 21a. In order to simplify the drawings, two neighboring substrate units 21a are drawn side by side in the following drawings. The first surface 211 of the package substrate 21 of each substrate unit 21a has a plurality of first conductive contacts 215. The second surface 212 of the package substrate 21 of each substrate unit 21a has a plurality of second conductive contacts 216 and a plurality of third conductive contacts 217. The plurality of second conductive contacts 216 and the plurality of third conductive contacts 217 are electrically connected with the plurality of corresponding first conductive contacts 215 through metal routes of the package substrate 21 or another appropriate electric conduction path.

Figure 2C:
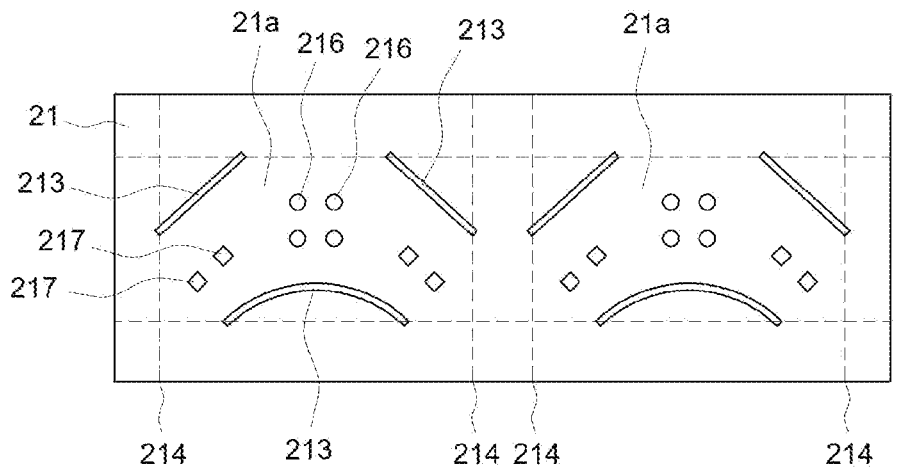
Figure 2D:
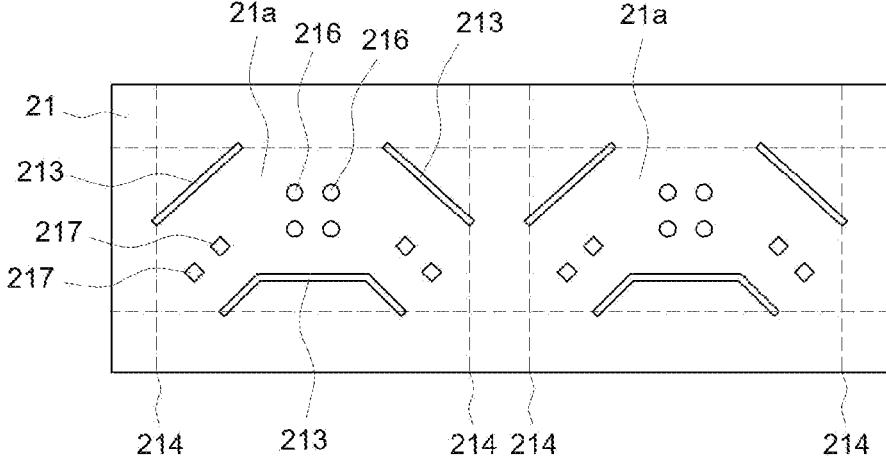

In general, the predetermined dicing line is in form of a straight line. Therefore, rectangular package substrates are generated after the package substrate is cut along the horizontal direction and the vertical direction. However, the contour of the substrate unit 21a is defined by at least one trench 213 and a plurality of predetermined cutting cannels 214. Therefore, the trench 213 with an appropriate shape may be used to define a non-rectangular substrate unit 21a. For example, in the embodiment shown in FIG. 2, the trench 213 has an arc shape; thus, the contour of the substrate unit 21a has arc-shaped regions, which favor assembling the image sensor package to the endoscope. It should be explained: the present invention does not limit the trench 213 to have an arc shape. The trench 213 may have another shape to favor assembling the image sensor package to the endoscope. Refer to FIG. 2c. The trench 213 may be in form of a straight line oblique with respect to the predetermined dicing line 214, whereby the contour of the substrate unit 21a has an apex angle larger than 90 degrees. Refer to FIG. 2d. The trench 213 may be in form of a polyline, which includes a plurality of short straight lines, whereby the contour of the substrate unit 21a has a recess. It is easily understood: appropriately designing the shapes of the trenches 213 can provide different contours for the substrate units 21a.

Figure 3A:
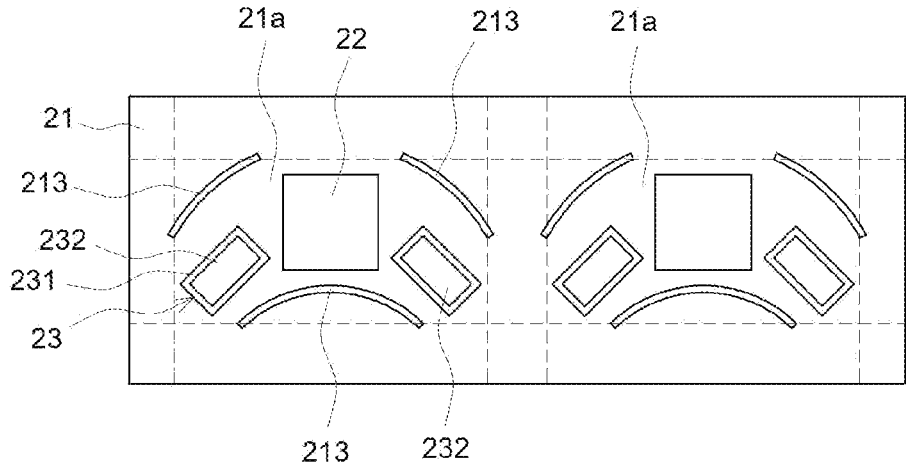
Figure 3B:
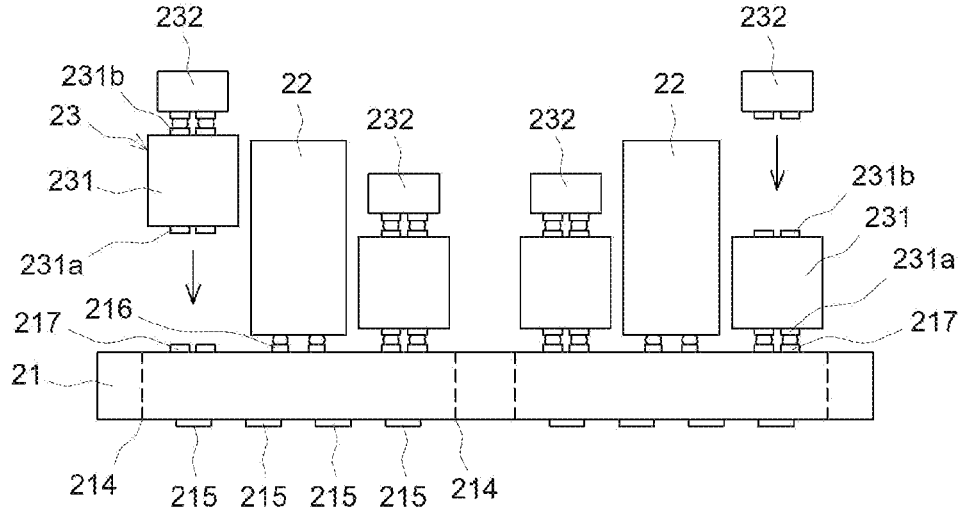

Refer to FIG. 3a and FIG. 3b, wherein FIG. 3a is a schematic top view, and FIG. 3b is a schematic side view. Next, place an image sensor 22 on the second surface 212 of the substrate unit 21a and perform a die-bonding process to electrically connect the image sensor 22 with the plurality of second conductive contacts 216 through an appropriate means, such as the solder joint method, the eutectic bonding method, solder paste, and silver glue. Next, place at least one light emitting element 23 on the second surface 212 of the substrate unit 21a and electrically connect the light emitting element 23 with the plurality of third conductive contacts 217 through an appropriate means, such as the solder joint method, the eutectic bonding method, solder paste, and silver glue. It is easily understood: the relative altitude of the image sensor 22 and the light emitting element 23 may influence illumination and imaging quality. For example, if the level of the light output surface of the light emitting element 23 is too low with respect to the level of the image sensor 22, the image sensor 22 may block the illumination light generated by the light emitting element 23 and thus generate shadows. If the level of the light input surface of the image sensor 22 is too low with respect to the light emitting element 23, the light emitting element 23 may block the imaging light reflected from the detected object. Alternatively, the illumination light generated by the light emitting element 23 may directly project onto the image sensor 22 and affect the imaging quality. Therefore, the relative altitude of the image sensor 22 and the light emitting element 23 should be optimized through adjusting the height of spacer 231.

Refer to FIG. 3b. In one embodiment, the light emitting element 23 includes a spacer 231 and a light emitting diode (LED) 232. The spacer 231 has a third surface (the downward surface of the spacer 231 shown in FIG. 3b) and a fourth surface (the upward surface of the spacer 231 shown in FIG. 3b), which are opposite to each other. The third surface of the spacer 231 has a plurality of fourth conductive contacts 231a. The fourth surface of the spacer 231 has a plurality of fifth conductive contacts 231b. The plurality of fifth conductive contacts 231b may be electrically connected with the plurality of corresponding fourth conductive contacts 231a through metal routes of the spacer 231 or another appropriate electric conduction path. The LED 232 is disposed on the fourth surface of the spacer 231 and electrically connected with the plurality of fifth conductive contacts 231b. The plurality of fourth conductive contacts 231a of the spacer 231 is electrically connected with the plurality of corresponding third conductive contacts 217 of the package substrate 21 to form electric conduction paths through solder paste, silver glue or another appropriate means. Therefore, the LED 232 may be electrically connected with external circuits to receive power or control signals via the electric conduction path, which extends from the fifth conductive contact 231*b* of the spacer 231 through the fourth conductive contact 231*a* of the spacer 231 and the third conductive contact 217 of the package substrate 21 to the first conductive contact 215 of the package substrate 21.

Based on the structure shown in FIG. 3*b*, the relative altitude of the light input surface of the image sensor 22 and the light output surface of light emitting element 23 is adjusted via adjusting the thickness of the spacer 231 to optimize illumination and imaging quality. In one embodiment, the spacer 231 has a preset thickness to make the level of the light input surface of the image sensor 22 is equal to or higher than the level of the light output surface of the LED 232 and make the difference of the levels of them smaller than or equal to a preset value. For example, the difference of the level of the light input surface of the image sensor 22 and the level of the light output surface of the LED 232 is smaller than or equal to 0.8 mm. It should be explained: the LED 232 may be disposed on the spacer 231 to form the light emitting element 23 beforehand, and then the light emitting element 23 is disposed on the package substrate 21, as shown by the light emitting element 23 on the left side of FIG. 3*b*. Alternatively, the spacer 231 is disposed on the package substrate 21 beforehand, and then the LED 232 is disposed on the spacer 231, as shown by the LED 232 on the right side of FIG. 3*b*.

In one embodiment, each substrate unit 21*a* has a plurality of light emitting elements 23, which are spatially separated, as shown in FIG. 3*a* and FIG. 3*b*. The spatially-separated light emitting elements 23 can increase the layout flexibility of the light emitting elements 23 and reduce the volumes of the image sensor package and the endoscope. In one embodiment, the plurality of light emitting elements 23 respectively emits lights of different wavelengths and may be operated simultaneously or separately for different observations. Although each light emitting element 23 only has one LED 232 in FIG. 3*a* and FIG. 3*b*, each light emitting element 23 may include a plurality of LEDs 232 respectively emitting lights of different wavelengths in some embodiments. It is easily understood: the plurality of light emitting elements 23 or the plurality of LEDs 232 of each light emitting element 23 may emit lights of the same wavelength to meet requirement of illumination or another target. In one embodiment, the light emitting element 23 may include a white light LED, an infrared LED, a blue LED, an ultraviolet LED, or a combination thereof.

Figure 4A:
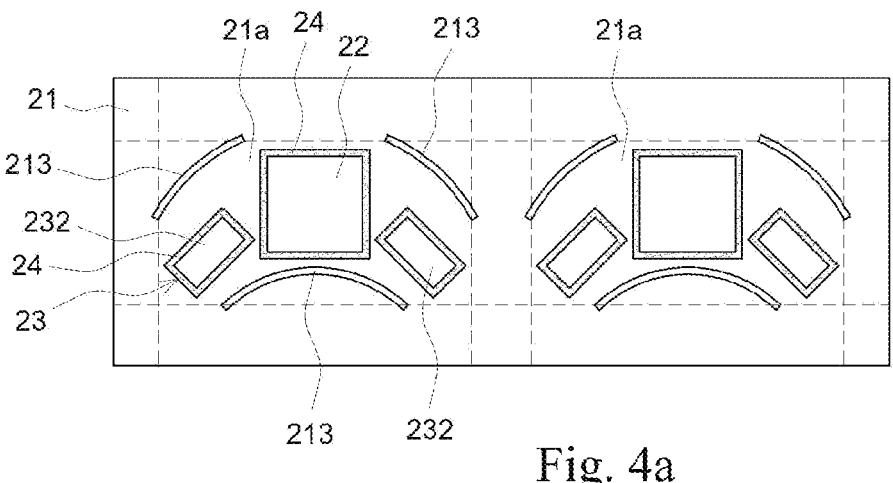
Figure 4B:
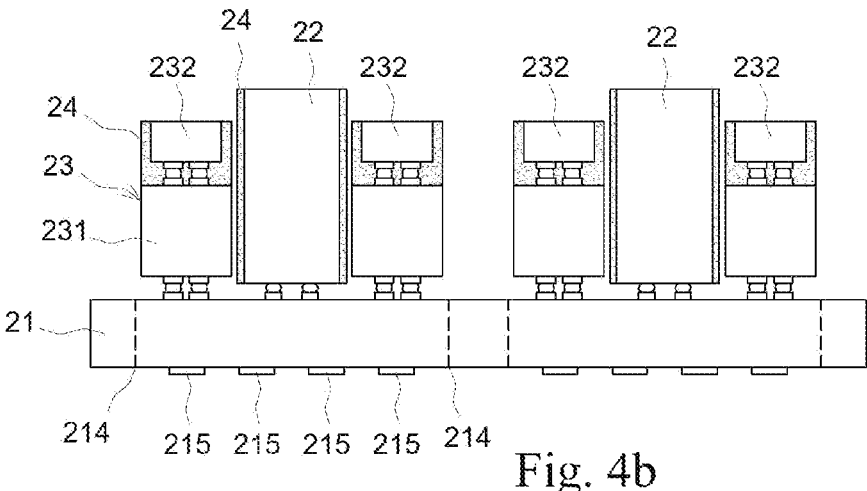
Figure 4C:
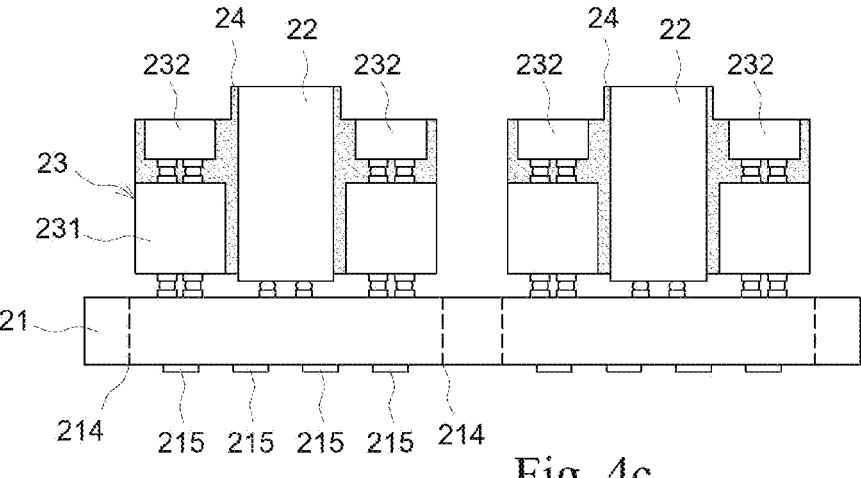

Refer to FIG. 4*a* and FIG. 4*b*, wherein FIG. 4*a* is a schematic top view, and FIG. 4*b* is a schematic side view. Next, form a shield structure 24 on the sidewall of at least one of the image sensor 22 and the light emitting element 23. The shield structure 24 can prevent from that the illumination light generated by the LED 232 or stray light directly enters the imaging system of the image sensor 22, whereby the imaging quality is promoted. In the embodiment shown in FIG. 4*a* and FIG. 4*b*, the shield structure 24 covers the sidewalls of the image sensor 22 and the light emitting element 23. However, the present invention is not limited by this embodiment. In one embodiment, it is sufficient for the shield structure 24 to cover only the sidewall of the image sensor 22 or the sidewall of the light emitting element 23. Refer to FIG. 4*c*. In one embodiment, the shield structure 24 is a resin filled into the space between the image sensor 22 and the LED 232, wherein the resin can be cured by ultraviolet light, heating or another appropriate means to cover the sidewalls of the image sensor 22 and the LED 232. It is easily understood: the resin may be an opaque resin or a semi-transparent resin. For example, the semi-transparent resin is a resin having a transmittance of 0.01%-50%. It should be explained: if the layout between the image sensor 22 and the LED 232 is optimized or the image sensor 22 has an appropriate shield structure, the manufacturing step show in FIG. 4*a* and FIG. 4*b* may be omitted.

Figure 5A:
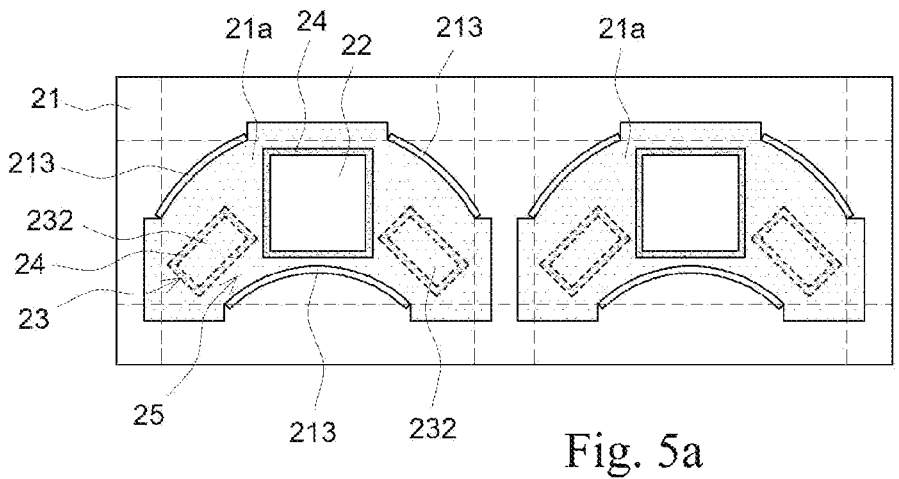
Figure 5B:
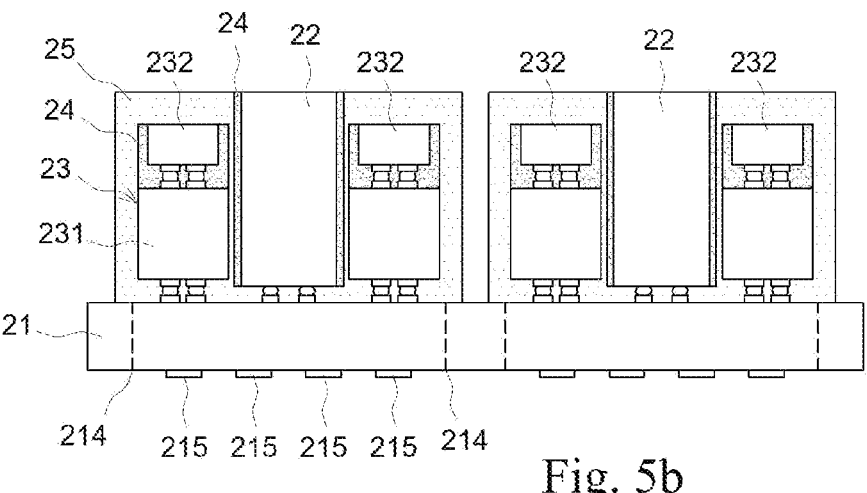
Figure 5C:
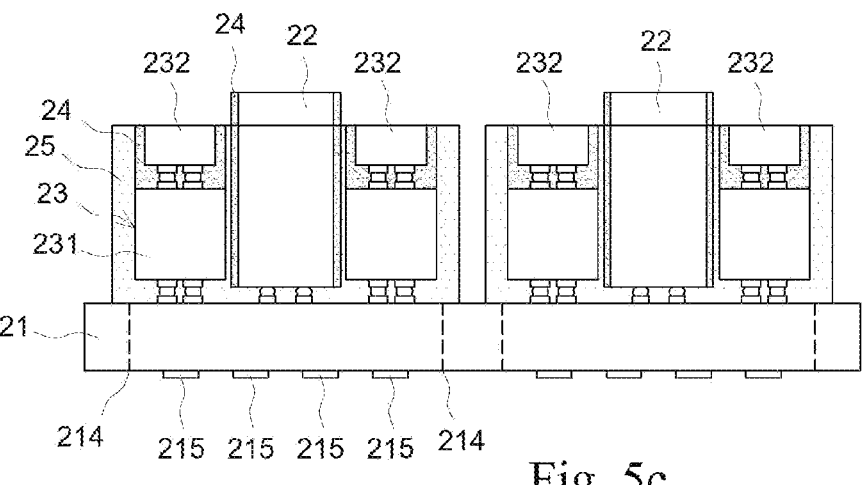

Refer to FIG. 5*a* and FIG. 5*b*, wherein FIG. 5*a* is a schematic top view, and FIG. 5*b* is a schematic side view. Next, form an encapsulation body 25 to cover the sidewalls of the image sensor 22 and the light emitting element 23. In the embodiment shown in FIG. 5*a* and FIG. 5*b*, the encapsulation body 25 not only covers the sidewall of the light emitting element 23 but also encloses the light emitting element 23 totally. It is easily understood: the encapsulation body 25 must be a high-transmittance resin in this embodiment. Refer to FIG. 5*c*. In one embodiment, the encapsulation body 25 does not enclose the light emitting element 23 totally but only covers the sidewall of the light emitting element 23. In this embodiment, the transmittance of the encapsulation body 25 is not limited. The encapsulation body 25 should avoid covering the light input surface of the image sensor 22 lest the imaging quality be affected. It should be explained: in one embodiment, the encapsulation body 25 does not cover the plurality of trenches 213 lest the opposite inner surfaces of the plurality of trenches 213 be stuck to each other. In one embodiment, a resin is filled into an appropriate mold and cured inside the mold to form the encapsulation body 25; then the semi-product is released from the mold. However, the present invention is not limited by this embodiment. In one embodiment, the mold is a one-time mold. In other words, after the resin is filled into the mold and cured inside the mold, the cured resin is not demolded, and the next fabrication step is undertaken in a non-demolded state.

Figure 6A:
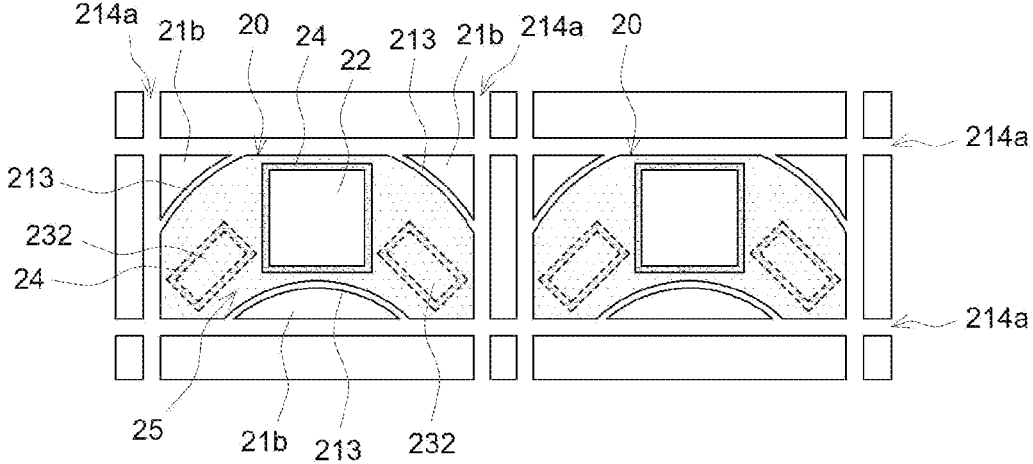
Figure 6B:
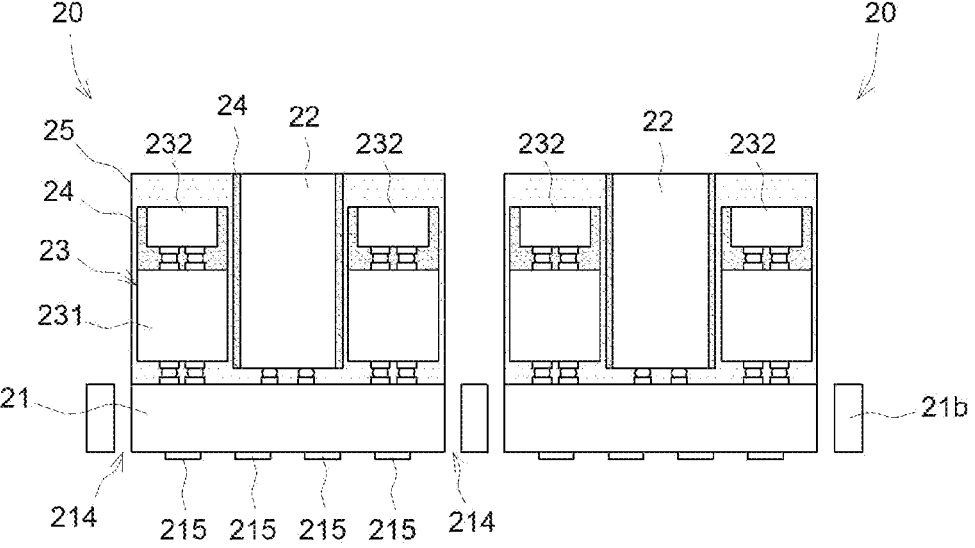

Refer to FIG. 6*a* and FIG. 6*b*, wherein FIG. 6*a* is a schematic top view; FIG. 6*b* is a schematic side view. Next, cut the package substrate 21 along the plurality of predetermined dicing lines 214 (as shown in FIG. 2*a*) to form a plurality of dicing lines 214*a* and separate the plurality of substrate units 21*a* (as shown in FIG. 2*a*) to form single image sensor packages 20. As the dicing lines 214*a* pass the trenches 213, the regions of the package substrates 21, which are outside the trenches 213, become waste materials and are separated from the substrate units 21*a*. Thus, the substrate unit 21*a* has the contour of the trench 213.

Figure 7:
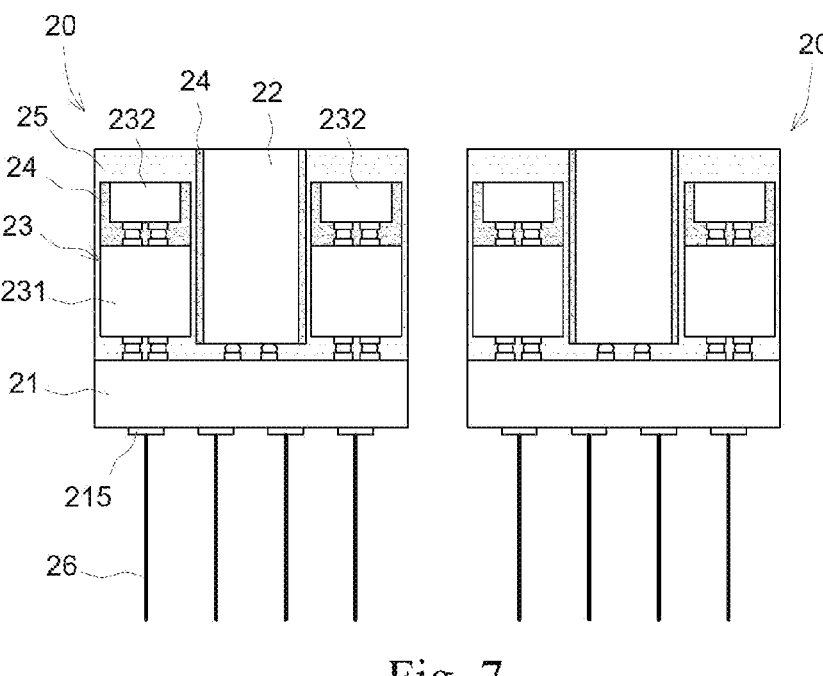
Figure 8:
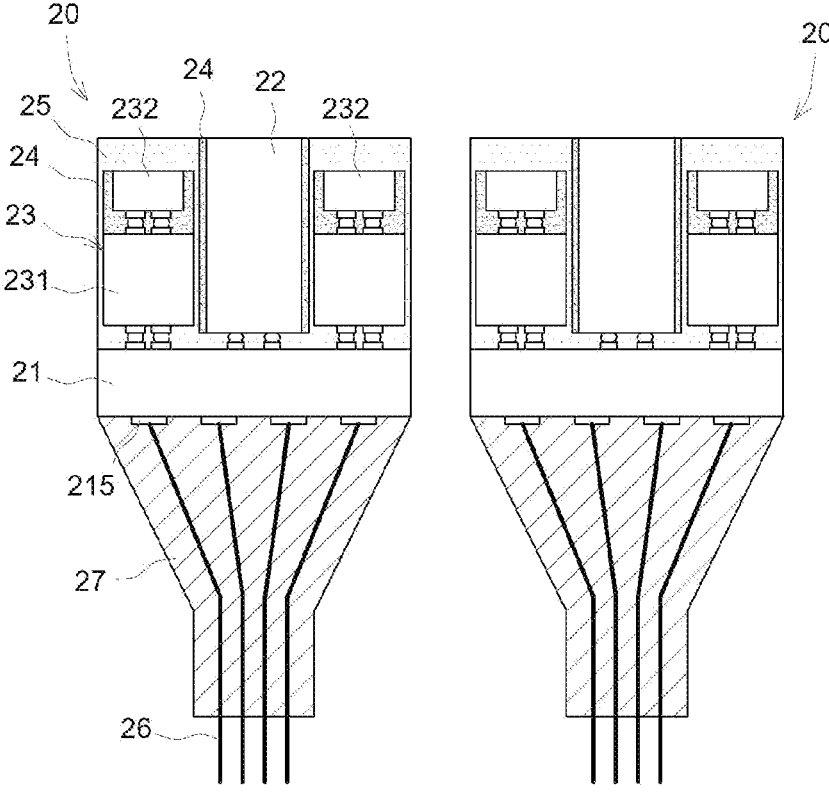

Refer to FIG. 7 and FIG. 8, which are schematic side views. Next, electrically connect a plurality of electric conduction wires 26 with the plurality of corresponding first conductive contacts 215 of the package substrate 21. Next, form a protection resin 27 to encapsulate the joint points of the plurality of first conductive contacts 215 and the plurality of electric conduction wires 26. Thus is completed the image sensor package of the present invention. It should be explained: the abovementioned method for manufacturing an image sensor package may be realized with the equipment and process of semiconductor package. Therefore, the image sensor and light emitting element of the present invention can achieve the precision and stability that the semiconductor package equipment can achieve. Thus, the present invention can realize the miniaturization and mass-production of the image sensor package.

Figure 9:
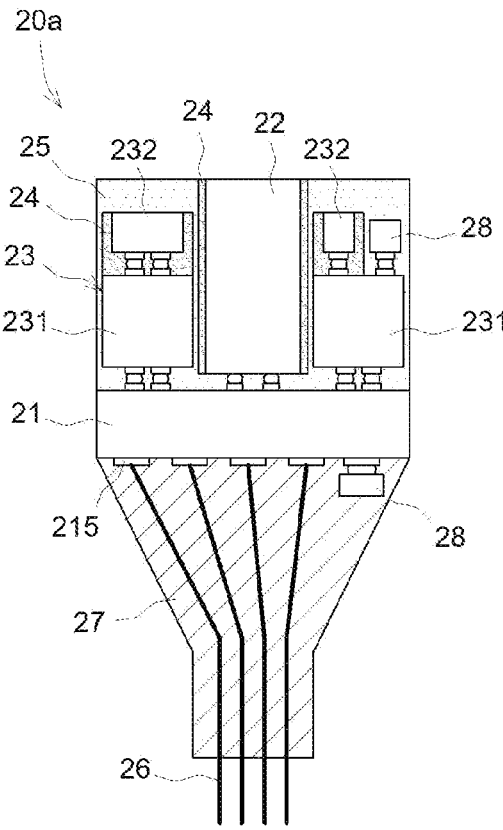
FIG. 9 is a diagram schematically showing an image sensor package according to one embodiment of the present invention.

Refer to FIG. 9. In one embodiment, the image sensor package 20*a* of the present invention further comprises a thermistor 28 and/or an electrostatic discharge (ESD) protection element 28. The thermistor can detect the operation temperature of the image sensor, whereby to guarantee that the operating endoscope is kept at the normal temperature range. For example, the thermistor may be a negative temperature coefficient (NTC) thermistor. The ESD protection element may be in parallel with the LED 232, whereby to enhance the ESD protection performance of the LED 232. In one embodiment, the thermistor 28 and/or the ESD protection element 28 may be disposed on the fourth surface of the spacer 231 and electrically connected with the spacer 231. In one embodiment, the thermistor 28 and/or the electrostatic discharge (ESD) protection element 28 may be disposed on the first or second surface (not designated in the drawing) of the package substrate 21 and electrically connected with the package substrate 21. In one embodiment, the thermistor 28 and/or the ESD protection element 28 may be disposed on the package substrate 21 or spacer 231 before the image sensor 22 and light emitting elements were disposed on the package substrate 21. In one embodiment, the thermistor 28 and/or the ESD protection element 28 may be disposed on the package substrate 21 or the spacer 231 after the image sensor 22 and light emitting elements were disposed on the package substrate 21.

Figure 10A:
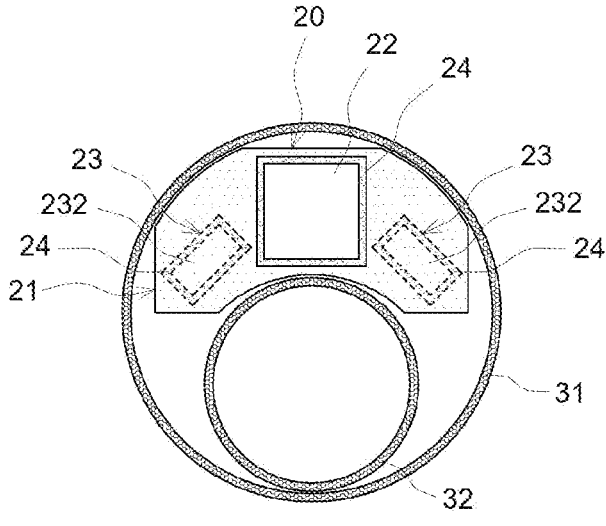
FIG. 10a and FIG. 10b are diagrams schematically showing an endoscope according to one embodiment of the present invention.
Figure 10B:
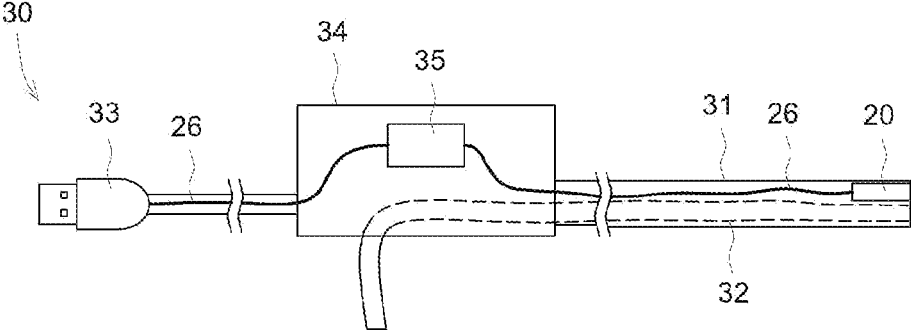

Refer to FIG. 10a and FIG. 10b, wherein FIG. 10a is a schematic axial view of a distal end of an endoscope; FIG. 10b is a schematic side view of the endoscope. In one embodiment, the endoscope 30 of the present invention comprises a first tube 31, a second tube 32, an image sensor package 20 and an electric connector 33. A distal end of the first tube 31 of the endoscope 30 is to be extended to a cavity, such as a cavity of a human body or a small space to be inspected in an industrial inspection. It is easily understood: the first tube 31 may be designed to have different appearances to meet different applications. In the embodiment shown in FIG. 10a, the first tube 31 is a round tube. The second tube 32 is disposed inside the first tube 31, functioning as a working channel. The operator may extend a working instrument through the second tube 32 into a cavity to undertake an intended work, such as sampling tissue, sucking out secretions/tissue fluids/blood, or supplying medicine.

The image sensor package 20 is disposed at the distal end of the first tube 31 and in a receiving space between the first tube 31 and the second tube 32, as shown in FIG. 10a. The image sensor package 20 captures images of a cavity and generates corresponding electronic signals. The detailed structure of the image sensor package 20 has been described hereinbefore and will not repeat again. As mentioned above, the contour of the image sensor package 20 may be defined by the trenches 213. If the arc-shaped trenches 213 define the arc surfaces of the external sides of the image sensor package 20, the arc surfaces of the external sides of the image sensor package 20 can match the inner surface of the first tube 31. Besides, the arc-shaped recess of the image sensor package 20 may accommodate the second tube 32 or even comply with the outer surface of the second tube 32. Therefore, the trenches 213 may be used to appropriately define the contour of the image sensor package 20 to effectively utilize the space between the first tube 31 and the second tube 32 and increase the layout flexibility of disposing electronic elements inside the image sensor package 20. For example, the light emitting element 23 may be disposed on a position of the package substrate 21, which is deviated from the image sensor 22; in other words, the light emitting element 23 is moved toward the second tube 32; thus, the illumination area is moved to between the image capturing direction of the image sensor 22 and the direction of the opening of the second tube 32. Besides, the arc-shaped recess of the image sensor package 20 favors the positioning of the image sensor package 20 and the second tube 32 and thus favors the succeeding assembly.

The electric conduction wires 26 of the image sensor package 20 are electrically connected with the electric connector 33, whereby the electronic signals generated by the image sensor package 20 can be transmitted through the electric connector 33 to an external electronic device, such as a computer, a mobile Internet-access device, or a dedicated electronic device of the endoscope. In one embodiment, the electric connector 33 is electrically connected with an external electronic device in a pluggable way. The electric connector 33 may be a USB interface, a connection interface of a mobile Internet-access device, or another appropriate electric connector.

In one embodiment, the endoscope 30 of the present invention further comprises a housing 34. The housing 34 is disposed between the image sensor package 20 and the electric connector 33. The design of the housing 34 may be varied according to requirement. For an example, the housing 34 may have an appearance suitable to be held by the operator. For another example, the shape of the housing 34 is suitable to be mounted on a carrier, such as a head-mounted carrier. In one embodiment, the endoscope 30 of the present invention further comprises an electronic element 35. The electronic element 35 is electrically connected with the image sensor package 20 and the electric connector 33. The electronic element 35 can process the electronic signals generated by the image sensor package 20 and transmit the electronic signals to an external electronic device through the electric connector 33. In one embodiment, the electronic element 35 is a microcontroller unit (MCU).

Figure 11:
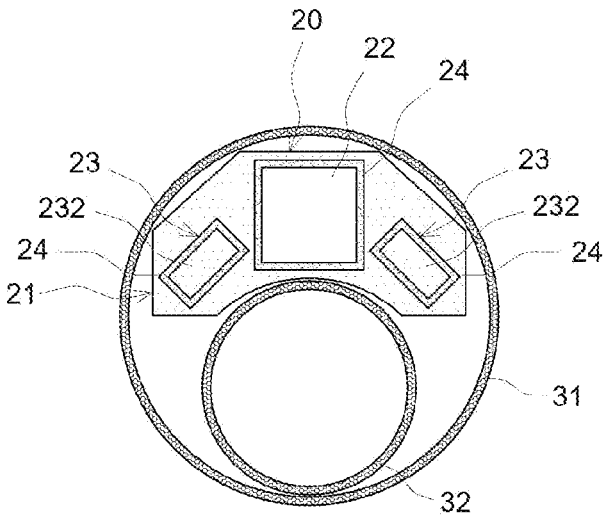
FIG. 11 is a diagram schematically showing an endoscope according to another embodiment of the present invention.
Figure 12:
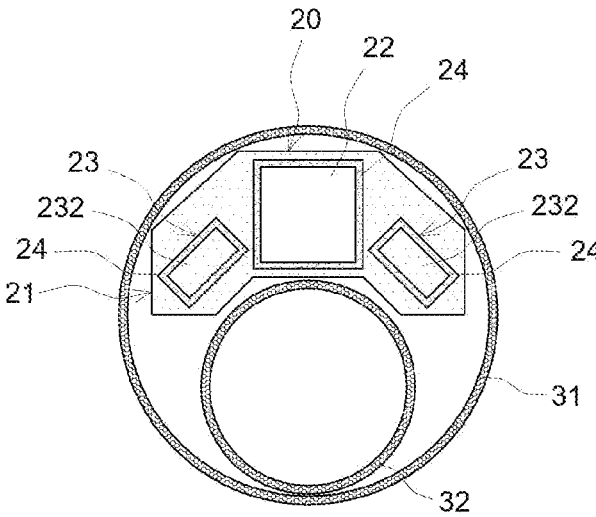
FIG. 12 is a diagram schematically showing an endoscope according to yet another embodiment of the present invention.

Refer to FIG. 11 and FIG. 12, which schematically show the endoscopes containing the image sensor packages 20 using the substrate units 21a in FIG. 2c and FIG. 2d. One side of the contour of the substrate unit 21a, which contacts the inner surface of the first tube 31, is defined by the trenches 213 to have an apex angle larger than 90 degrees, whereby is increased the utilization efficiency of the space between the first tube 31 and the second tube 32. Besides, the recess defined by the trenches 213 can accommodate the second tube 32, whereby is further increased the utilization efficiency of the space between the first tube 31 and the second tube 32. In the case of using identical elements and identical layout, the present invention can effectively reduce the volume of endoscopes.

In conclusion, the present invention proposes an image sensor package and a method for manufacturing the same, wherein appropriate trenches are formed in the package substrate, and wherein the package substrate is cut along the existing horizontal and vertical dicing lines to obtain the required contour, whereby the image sensor package of the present invention can achieve the maximum space utilization efficiency in the distal end of the endoscope, and whereby the contour of the image sensor package matches the distal end of the endoscope and favors the positioning and assembly of the image sensor package.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the appended claims.

What is claimed is:

1. A method for manufacturing an image sensor package, comprising steps:

providing a package substrate, wherein the package substrate comprises a first surface, a second surface opposite to the first surface, a plurality trenches and a plurality of predetermined dicing lines; the plurality of trenches penetrates the first surface and the second surface and cooperates with the plurality of predetermined dicing lines to define a plurality of substrate units arranged in array; the first surface of the package substrate of each substrate unit has a plurality of first conductive contacts; the second surface of the package substrate of each substrate unit has a plurality of second conductive contacts and a plurality of third conductive contacts; the plurality of second conductive contacts and the plurality of third conductive contacts are electrically connected with the plurality of corresponding first conductive contacts;

disposing an image sensor on the second surface of the package substrate and electrically connecting the image sensor with the plurality of second conductive contacts;

disposing at least one light emitting element on the second surface of the package substrate and electrically connecting the at least one light emitting element with the plurality of third conductive contacts;

forming an encapsulation body covering sidewalls of the image sensor and the light emitting element and avoiding covering the plurality of trenches and a light input surface of the image sensor; and cutting the package substrate along the plurality of predetermined dicing lines to separate the plurality of substrate units and generate single image sensor packages.

2. The method for manufacturing an image sensor package according to claim 1, wherein the light emitting element further includes a spacer, disposed on the second surface of the package substrate and having a third surface and a fourth surface opposite to the third surface, wherein the third surface has a plurality of fourth conductive contacts electrically connected with the plurality of corresponding third conductive contacts; the fourth surface has a plurality of fifth conductive contacts electrically connected with the plurality of corresponding fourth conductive contacts; and at least one light emitting diode (LED), disposed on the fourth surface of the spacer and electrically connected with the plurality of fifth conductive contacts, wherein the spacer has a preset thickness to make a level of the light input surface of the image sensor higher than or equal to a level of a light output surface of the LED; a difference of the level of the light input surface of the image sensor and the level of the light output surface of the LED is smaller than or equal to a preset value.

3. The method for manufacturing an image sensor package according to claim 2, wherein the difference of the level of the light input surface of the image sensor and the level of the light output surface of the LED is smaller than or equal to 0.8 mm.

4. The method for manufacturing an image sensor package according to claim 1, wherein a plurality of light emitting elements is disposed on the second surface of the package substrate and spatially separated from each other.

5. The method for manufacturing an image sensor package according to claim 1, wherein a plurality of light emitting elements is disposed on the second surface of the package substrate and emits lights respectively having different wavelengths or having an identical wavelength; alternatively, the light emitting element includes a plurality of light emitting diodes emitting lights respectively having different wavelengths or having an identical wavelength.

6. The method for manufacturing an image sensor package according to claim 2, wherein the light emitting element includes at least one of a thermistor and an electrostatic discharge (ESD) protection element, which is disposed on the fourth surface of the spacer and electrically connected with the spacer.

7. The method for manufacturing an image sensor package according to claim 1, wherein the package substrate of each substrate unit includes at least one of a thermistor and an electrostatic discharge (ESD) protection element, which is disposed on the first surface or second surface of the package substrate and electrically connected with the package substrate.

8. The method for manufacturing an image sensor package according to claim 1, wherein at least one of the plurality of trenches is in form of an arc, an oblique straight line, or a polyline.

9. The method for manufacturing an image sensor package according to claim 1, wherein the package substrate of the substrate unit has a contour of a non-rectangular shape.

10. The method for manufacturing an image sensor package according to claim 1, wherein the encapsulation body is manufactured with a one-time mold; the package substrate is cut in a non-demolded state.

11. The method for manufacturing an image sensor package according to claim 1, further comprising a step:

forming a shield structure on the sidewall of at least one of the image sensor and the light emitting element.

12. The method for manufacturing an image sensor package according to claim 11, wherein the shield structure is made of an opaque resin or a semi-transparent resin and covers the sidewalls of the image sensor and the light emitting element.

13. The method for manufacturing an image sensor package according to claim 1, further comprising a step:

electrically connecting a plurality of electric conduction wires with the plurality of corresponding first conductive contacts.

14. The method for manufacturing an image sensor package according to claim 8, further comprising a step:

forming a protection resin to encapsulate joint points of the plurality of first conductive contacts and the plurality of electric conduction wires.

15. An image sensor package manufactured by the method for manufacturing an image sensor package according to claim 1.

16. An endoscope, comprising a first tube, having a distal end to be extended into a cavity;

a second tube, disposed inside the first tube to function as a working channel;

an image sensor package, manufactured by the method for manufacturing an image sensor package according to claim 1, disposed at the distal end of the first tube and in a receiving space between the first tube and the second tube; and an electric connector, electrically connected with the image sensor package and enabling the endoscope to be electrically connected with an external electronic device in a pluggable way.

17. The endoscope according to claim 16, further comprising an electronic element, electrically connected with the image sensor package and the electric connector and processing electronic signals generated by the image sensor package.

18. The endoscope according to claim 16, further comprising a housing, disposed between the image sensor package and the electric connector.

* * * * *